(12) United States Patent
Takazaki

(10) Patent No.: US 9,120,933 B2
(45) Date of Patent: Sep. 1, 2015

(54) WHITE HARD DECORATIVE MEMBER

(75) Inventor: Kotaro Takazaki, Saitama (JP)

(73) Assignees: CITIZEN HOLDINGS CO., LTD., Tokyo (JP); CITIZEN WATCH CO., LTD., Tokyo (JP)

( * ) Notice: Subject to any disclaimer, the term of this patent is extended or adjusted under 35 U.S.C. 154(b) by 104 days.

(21) Appl. No.: 13/821,335

(22) PCT Filed: Sep. 20, 2011

(86) PCT No.: PCT/JP2011/071932
§ 371 (c)(1),
(2), (4) Date: Mar. 7, 2013

(87) PCT Pub. No.: WO2012/039501
PCT Pub. Date: Mar. 29, 2012

(65) Prior Publication Data
US 2013/0171448 A1   Jul. 4, 2013

(30) Foreign Application Priority Data

Sep. 21, 2010   (JP) ................................ 2010-210525

(51) Int. Cl.
| | | |
|---|---|---|
| *C09D 5/08* | (2006.01) | |
| *C23C 14/24* | (2006.01) | |
| *C23C 14/00* | (2006.01) | |
| *C23C 14/06* | (2006.01) | |
| *C23C 14/08* | (2006.01) | |
| *C23C 14/16* | (2006.01) | |
| *C23C 14/34* | (2006.01) | |

(52) U.S. Cl.
CPC .............. *C09D 5/08* (2013.01); *C23C 14/0015* (2013.01); *C23C 14/0635* (2013.01); *C23C 14/083* (2013.01); *C23C 14/165* (2013.01); *C23C 14/34* (2013.01); *Y10T 428/265* (2015.01)

(58) Field of Classification Search
None
See application file for complete search history.

(56) References Cited

U.S. PATENT DOCUMENTS

| | | |
|---|---|---|
| 2004/0093730 A1 | 5/2004 | Miya et al. |
| 2010/0018250 A1 | 1/2010 | Miya et al. |
| 2010/0086756 A1 | 4/2010 | Miya et al. |
| 2012/0187390 A1* | 7/2012 | Okamoto et al. .............. 257/40 |

FOREIGN PATENT DOCUMENTS

| | | |
|---|---|---|
| JP | 2004-043959 A | 2/2004 |
| JP | 2005-076085 A | 3/2005 |
| JP | 2005-146304 A | 6/2005 |

(Continued)

OTHER PUBLICATIONS

International Search Report for PCT/JP2011/071932, Dec. 6, 2011.

*Primary Examiner* — Vera Katz

(57) ABSTRACT

In order to provide a white hard decorative member being remarkably enhanced in scratch resistance and abrasion resistance and having a high-quality color impression, and furthermore supply a product capable of freely controlling the color tone, corrosion resistance performance, and etching performance, the white hard decorative member includes a base material having thereon an alloy adherence layer having a high adherence effect, an alloy gradient adherence layer in which the reaction gas content is gradually increased, an abrasion-resistant layer having high hardness, and an alloy color-up gradient layer in which the reaction gas content is gradually decreased, which are formed by using a film of an alloy combining a metal having a high adherence effect to a metal and high brightness, a metal having high film hardness and high corrosion resistance, and a metal for enhancing the corrosion performance.

13 Claims, 8 Drawing Sheets

(56) References Cited

FOREIGN PATENT DOCUMENTS

| JP | 2006-257524 A | 9/2006 |
| JP | 2006-265597 A | 10/2006 |
| JP | 2007-262472 A | 10/2007 |
| JP | 2007-262482 A | 10/2007 |
| WO | 03/056966 A1 | 7/2003 |
| WO | 2008/041562 A1 | 4/2008 |
| WO | WO 2011040238 A1 * | 4/2011 |

* cited by examiner

WHITE HARD DECORATIVE MEMBER

TECHNICAL FIELD

The present invention relates to a decorative member having a metallic color for an exterior component of a watch, a personal ornament such as eyeglasses, decorative trim, a sporting good and the like. More specifically, the present invention relates to a white hard decorative member having a high-quality color and exhibiting excellent resistance to scratches, abrasions and corrosion over a long period of time.

BACKGROUND ART

Conventionally, in order to impart a luxurious appearance, a platinum coat with high brightness has been formed as the outermost surface layer on an abrasion-resistant layer responsible for increasing the scratch resistance of an exterior component, a personal ornament such as eyeglasses, watch, decorative trim, a sporting good and the like. For example, in Patent Document 1, an underlying layer is formed on a base material, a titanium carbide layer is formed on the surface thereof by a dry plating method, and a decorative coat layer composed of platinum or platinum alloy is formed on the surface thereof by a dry plating method. However, the platinum layer as the outermost layer is expensive and therefore, must be thinly deposited, and the titanium carbide layer needs to be formed in a light color so as to inhibit color change upon separation of the thin platinum layer. In turn, the hardness of the titanium carbide layer is lower than the hardness of the original titanium carbide layer (by about 40%), and sufficient scratch resistance cannot be obtained.

Furthermore, when the amount of carbon in the titanium carbide layer is increased in order to increase the hardness and thereby enhance the scratch resistance, the scratch resistance may be enhanced, but the color tone turns dark. Also, when the film thickness of the titanium carbide layer as the hardened layer is increased so as to again enhance the scratch resistance, this results in separation of the film due to an increase in the film stress or generation of pitting corrosion in a corrosion, and therefore it has been difficult to deposit a film at a thickness of 1.0 µm or more.

In addition, the platinum-based coat has a problem that an allergy occurs upon contact with human skin.

Therefore, it has been proposed to use, as the outermost layer, an Mo coat exhibiting good performance in terms of brightness, color tone and low splash potential and having scratch resistance and a high-grade quality in place of the platinum-based coat. However, the Mo coat is disadvantageously low in corrosion resistance and cannot be used as it is. Also, use of a Cr coat exhibiting good performance in terms of brightness, color tone and low splash potential and having a high-grade quality has been proposed, but the Cr film has a problem that sufficient scratch resistance cannot be obtained because of low film hardness and separation in the production process is difficult because of very high corrosion resistance. Furthermore, it has been proposed to use, as the outermost layer, a Nb carbide film or a Ta carbide film each having high hardness and corrosion resistance, but these films also have a problem that the film thickness cannot be increase because of poor adherence to a base material and the brightness is slightly low.

RELATED ART

Patent Document

Patent Document 1: Japanese Unexamined Patent Publication (Kokai) No. 2004-043959

Patent Document 2: Japanese Unexamined Patent Publication (Kokai) No. 2007-262472

SUMMARY OF THE INVENTION

Problems to be Solved by the Invention

An object of the present invention is to provide a white hard decorative member being remarkably enhanced in scratch resistance and thereby prevented from reduction in the exterior quality due to scratches or abrasion and having a high-quality color, and furthermore supply a product capable of freely controlling the film hardness, scratch resistance performance, abrasion resistance performance, color tone, corrosion resistance performance, etching performance and allergic activity.

Means to Solve the Problems

In order to attain the above-described object, the white hard decorative member of the present invention employs the configurations described below.

The white hard decorative member includes a base material having thereon an adherence layer composed of an alloy lower oxide having a high adherence effect, a gradient adherence layer composed of an alloy compound, in which the reaction gas content is gradually increased, an abrasion-resistant layer composed of an alloy compound, and a color-up gradient layer composed of an alloy compound, in which the reaction gas content is gradually decreased.

The white hard decorative member of the present invention includes a base material having thereon an alloy adherence layer having a high adherence effect, an alloy gradient adherence layer where the reaction gas content is gradually increased, an abrasion-resistant layer having a high hardness, and an alloy color-up gradient layer where the reaction gas content is gradually decreased, which are formed by using a film of an alloy combining a metal (Mo, W) having a high adherence effect to a metal and high brightness but being poor in the corrosion resistance, a metal (Nb, Ta) having high film hardness and high corrosion resistance but being poor in the adherence, and if desired, a metal (Cr, Ti, Hf, Zr) for enhancing the corrosion performance, so that not only the adherence between the base material and the film can be remarkably enhanced and the scratch resistance can be increased but also the abrasion-resistant layer having high film hardness can be formed at a large thickness and in turn, the scratch resistance can be further increased; and in addition, these are materials capable of freely controlling the corrosion resistance, brightness, etching performance and allergic activity by the alloying ratio, so that a decorative member satisfying all of high scratch resistance performance, high abrasion resistance performance, high-grade quality and high corrosion resistance, which are unobtainable as a personal ornament or a decorative trim by conventional techniques, can be obtained.

The gist of the present invention resides in the following.

(1) A white hard decorative member including a base material, an adherence layer composed of a lower oxide layer of an alloy combining a metal M1, a metal M2 and selectively, a metal M3, which is stacked on the base material, a gradient adherence layer composed of a reaction compound between an alloy combining a metal M4, a metal M5 and selectively, a metal M6 and a non-metal element selected from one member or two or more members of nitrogen, carbon and oxygen, which is stacked on the adherence layer, an abrasion-resistant layer composed of a reaction compound between an alloy combining a metal M7, a metal M8 and selectively, a metal M9 and a non-metal element selected from one member or two or more members of nitrogen, carbon and oxygen, which is stacked on the gradient adherence layer, and a color-up gradient layer composed of a reaction compound between an alloy combining a metal M10, a metal M11 and selectively, a metal M12 and a non-metal element selected from one member or two or more members of nitrogen, carbon and oxygen, which is stacked on the abrasion-resistant layer, wherein each of the metals M1, M4, M7 and M10 is selected from one or two of Mo and W, each of the metals M2, M5, M8 and M11 is selected from one or two of Nb and Ta, each of the metals M3, M6, M9 and M12 is selected from one member or two or more members of Cr, Ti, Hf and Zr, the non-metal element content in the reaction compound constituting the gradient adherence layer is gradually increased in the thickness direction with distance from the substrate and the non-metal element content in the reaction compound constituting the color-up gradient layer is gradually decreased in the thickness direction distance from the substrate.

(2) The white hard decorative member according to (1) above, wherein the metals M3, M6, M9 and M12 are Cr.

(3) The white hard decorative member according to (1) above, wherein in each of the layers, the alloying compositional ratio of the metal M1, M4, M7 or M10 and the metal M2, M5, M8 or M11 is 70 wt % or more based on all alloys.

(4) The white hard decorative member according to (1) above, wherein the exterior color of the decorative member is a white color or a stainless steel color.

(5) The white hard decorative member according to (1) above, wherein the thickness of the abrasion-resistant layer is from 0.5 to 4 μm.

(6) The white hard decorative member according to (1) above, wherein each of the adherence layer and the gradient adherence layer contains a slight amount of oxygen.

(7) A watch having an exterior component that is partially or entirely constituted by the white hard decorative member according to any one of (1) to (6) above.

(8) A method for manufacturing a white hard decorative member, the method including the steps of stacking, on a base material, an adherence layer composed of a lower oxide layer of an alloy combining a metal M1, a metal M2 and selectively, a metal M3, stacking, on the adherence layer, a gradient adherence layer composed of a reaction compound between an alloy combining a metal M4, a metal M5 and selectively, a metal M6 and a non-metal element selected from one member or two or more members of nitrogen, carbon and oxygen such that the non-metal element content in the reaction mixture constituting the gradient adherence layer is gradually increased in the thickness direction with distance from the substrate, stacking, on the gradient adherence layer, an abrasion-resistant layer composed of a reaction compound between an alloy combining a metal M7, a metal M8 and selectively, a metal M9 and a non-metal element selected from one member or two or more members of nitrogen, carbon and oxygen, and stacking, on the abrasion-resistant layer, a color-up gradient layer composed of a reaction compound between an alloy combining a metal M10, a metal M11 and a metal M12 and a non-metal element selected from one member or two or more members of nitrogen, carbon and oxygen such that the non-metal element content in the reaction compound constituting the color-up gradient layer is gradually decreased in the thickness direction with distance from the substrate, wherein each of the metals M1, M4, M7 and M10 is selected from one or two of Mo and W, each of the metals M2, M5, M8 and M11 is selected from one or two of Nb and Ta, and each of the metals M3, M6, M9 and M12 is selected from one member or two or more members of Cr, Ti and Hf.

(9) The method for manufacturing a white hard decorative member according to (8) above, wherein in each of the layers, the alloying compositional ratio of the metal M1, M4, M7 or M10 and the metal M2, M5, M8 or M11 is 70 wt % or more based on all alloys.

(10) The method for manufacturing a white hard decorative member according to (8) above, wherein the abrasion-resistant layer is stacked at a thickness of 0.5 to 4 μm.

(11) The method for manufacturing a white hard decorative member according to (8) above, wherein a slight amount of oxygen is incorporated into each of the adherence layer and the gradient adherence layer.

(12) The method for manufacturing a white hard decorative member according to any one of (8) to (11) above, wherein at least one of the adherence layer, the gradient adherence layer, the abrasion-resistance layer and the color-up gradient layer is stacked by a reactive sputtering method.

(13) The method for manufacturing a white hard decorative member according to (12) above, wherein in the reactive sputtering method, each of the gradient adherence layer and the color-up gradient layer is stacked by increasing or decreasing in a time-series manner the amount of the reaction gas containing the non-metal element.

Effects of the Invention

A white hard decorative member being prevented from reduction in the exterior quality due to scratch or abrasion and having a high-quality color can be provided, and furthermore, a product capable of freely controlling the film hardness, scratch resistance performance, abrasion resistance performance, color tone, corrosion resistance performance, etching performance and allergic activity can be provided.

Figure 1:
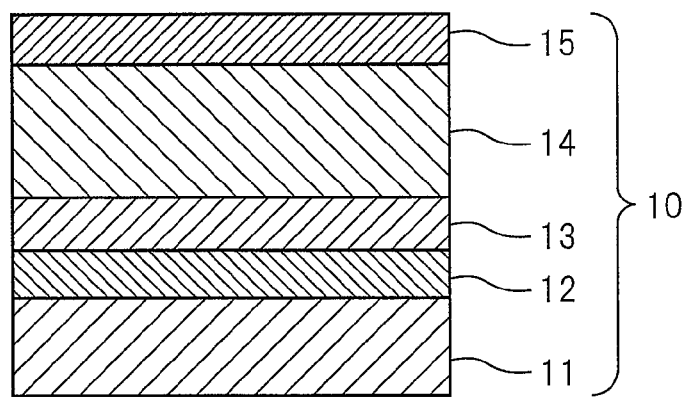
FIG. 1

A cross-sectional schematic view illustrating one example of the structure of the white hard decorative member.

FIG. 2

A cross-sectional schematic view of the white hard decorative member 20 of Example 1.

FIG. 3

A graph illustrating the changes in hardness and brightness with respect to the amount of methane gas introduced in Example 1.

FIG. 4

A scratch resistance measurement graph of the white hard decorative member 20 of Example 1.

FIG. 5

A cross-sectional schematic view of the white hard decorative member 30 of Example 2.

FIG. 6

A graph illustrating the changes in hardness and brightness with respect to the amount of methane gas introduced in Example 2.

FIG. 7

A scratch resistance measurement graph of the white hard decorative member 30 of Example 2.

FIG. 8

A cross-sectional schematic view of the white hard decorative member 40 of Example 3.

FIG. 9

A graph illustrating the changes in hardness and brightness with respect to the amount of methane gas introduced in Example 3.

FIG. 10

A scratch resistance measurement graph of the white hard decorative member 40 of Example 3.

FIG. 11

A cross-sectional schematic view of the white hard decorative member 50 of Example 4.

FIG. 12

A graph illustrating the changes in hardness and brightness with respect to the amount of methane gas introduced in Example 4.

FIG. 13

A scratch resistance measurement graph of the white hard decorative member 50 of Example 4.

FIG. 14

A cross-sectional schematic view of the white hard decorative member 60 of Example 5.

FIG. 15

A graph illustrating the changes in hardness and brightness with respect to the amount of methane gas introduced in Example 5.

FIG. 16

A scratch resistance measurement graph of the white hard decorative member 60 of Example 5.

MODE FOR CARRYING OUT THE INVENTION

The mode for carrying out the present invention is described below by referring to the drawings.

<Hard Decorative Member>

FIG. 1 is a cross-sectional schematic view illustrating one example of the white hard decorative member. The decorative member has a configuration where an adherence layer 12 composed of a lower oxide of an MoNb alloy is formed on the surface of an SUS316L base material 11 as the base material, a gradient adherence layer 13 composed of a lower oxide of an MoNb alloy in which the nitrogen content is gradually increased is formed on the adherence layer 12, an abrasion-resistance layer 14 that is an MoNb alloy nitride layer is formed on the gradient adherence layer 13, and an MoNb alloy color-up gradient layer 15 in which the nitrogen content is gradually decreased is formed on the abrasion-resistant layer 14.

The white hard decorative member employs an alloy film, the adherence performance, film hardness, scratch resistance performance, abrasion resistance performance, color tone, corrosion resistance performance, etching performance and allergic activity can be freely controlled.

In the white hard decorative member, a distinct interface between the adherence layer 12 and the gradient adherence layer 13 is eliminated and high adherence to the base material is secured; due to a structure where the film stress gradually increases, an effect of suppressing generation of a crack and separation due to a stress strain is obtained and in turn, the scratch resistance and abrasion resistance are enhanced; and at the same time, the abrasion-resistant layer 14 having high film hardness can be formed at a large thickness and therefore, higher scratch resistance performance can be achieved.

The abrasion-resistant layer 14 of the white hard decorative member 10 is constituted by an MoNb alloy nitride layer deposited with a nitrogen content exhibiting a maximum hardness, so that the composite hardness of the hard decorative member as a whole can be increased and high scratch resistance performance can be obtained.

The exterior color of the white hard decorative member 10 is controlled by the color-up gradient layer 15. Due to a structure where the non-metal element content is gradually decreased from the abrasion resistance layer 14, the color tone gradually increases, making it difficult to recognize a scratch even when scratched, and a high-quality color impression with metallic luster is obtained.

Thus, the white hard decorative member overcomes the problems of conventional techniques.

The white hard decorative member 10 is formed from a base material 11, an adherence layer 12 formed on the base material 11 surface, a gradient adherence layer 13 formed on the adherence layer 12, an abrasion-resistant layer 14 formed on the gradient adherence layer 13, and a color-up gradient layer 15 formed on the abrasion-resistant layer 14.

(Base Material)

The base material 11 is a base material formed of a metal or a ceramic. Specific examples of the metal (including an alloy) include stainless steel, titanium, a titanium alloy, copper, a copper alloy, tungsten, and a hardened stainless steel, titanium or titanium alloy. One of these metals may be used alone, or two or more thereof may be used in combination. The shape of the base material 11 is not limited.

(Adherence Layer)

The adherence layer 12 is a lower oxide film of an alloy combining a metal (M1) selected from one or two of Mo and W, and a metal (M2) selected from one or two of Nb and Ta, or further adding a metal (M3) selected from one member or two or more members of Cr, Ti, Hf and Zr, and these are selected according to the compatibility with the material as the base material and usage environment of the coat. The adherence layer 12 is composed of a lower oxide film of such an alloy but may contain a slight amount of carbon or nitrogen. Also, the alloy may contain a metal such as V, B, Al, Si, Mn, Co, La, Ce, Y and Sc in a total ratio of 5 wt % or less based on the alloy, in addition to the metals M1, M2 and M3.

The oxygen content in the alloying metal lower oxide film of the adherence layer is preferably from 5 to 60 atm %, more preferably from 5 to 45 atm %, based on the metal. If the oxygen content is less than 5 atm %, the adherence has no difference from that of an alloying metal film, and if the oxygen content exceeds 60 atm %, the adherence is reduced and the scratch resistance is also reduced.

The thickness of the adherence layer that is an alloy lower oxide film is preferably from 0.03 to 0.3 μm. For obtaining an effect of enhancing the adherence by the adherence layer, an efficient effect is obtained by a thickness of 0.03 μm or more, and even if the thickness exceeds 0.3 μm, the adherence effect does not change so much.

(Gradient Adherence Layer)

The gradient adherence layer 13 is constituted by a film formed of a reaction compound between an alloy combining a metal M4 selected from one or two of Mo and W and a metal M5 selected from one or two of Nb and Ta or further adding a metal M6 selected from one member or two or more members of Cr, Ti, Hf, Zr, and a non-metal element selected from one member or two or more members of carbon, nitrogen and oxygen, in which the non-metal element content is gradually increased, preferably a film in which the content of one or more kinds of non-metal elements selected from carbon, nitrogen and oxygen is gradually increased, for example, a carbide film, a nitride film, a carbonitride film, an oxynitride film, an oxycarbide film or an oxynitride-carbide film. Determination of what a material should be selected is dependent on the compatibility with the adherence layer 12 and the abrasion-resistant layer 14 and the usage environment of the coat. Also, the alloy may contain a metal such as V, B, Al, Si, Mn, Co, La, Ce, Y and Sc in a total ratio of 5 wt % or less based on the alloy, in addition to the metals M4, M5 and M6.

As for the content of one kind or two or more kinds of non-metal elements selected from carbon, nitrogen and oxygen in the gradient adherence layer, the layer is a gradient film in which the non-metal element content is gradually increased in the range of 0 to 50 atm % based on the alloying metal element. The gradient adherence layer preferably contains from 5 to 25 atm % of oxygen and more preferably has a structure containing carbon, nitrogen or a mixed element thereof such that the content of the element is gradually increased in the range of 0 to 50 atm %.

The thickness of the gradient adherence layer is preferably from 0.05 to 0.3 μm. For obtaining the effect of the gradient adherence layer, an efficient effect is obtained by a thickness of 0.05 μm or more, and even if the thickness exceeds 0.3 μm, the adherence effect does not change very much.

(Abrasion-Resistant Layer)

The abrasion-resistant layer 14 is formed of a reaction compound between an alloy combining a metal M7 selected from one or two of Mo and W and a metal M8 selected from one or two of Nb and Ta or further adding a metal (M9) selected from one member or two or more members of Cr, Ti, Hf and Zr, and a non-metal element selected from one member or two or more members of carbon, nitrogen and oxygen. Determination of what a material should be selected is dependent on the required external color and the usage environment of the coat. Also, the alloy may contain a metal such as V, B, Al, Si, Mn, Co, La, Ce, Y and Sc in a total ratio of 5 wt % or less based on the alloy, in addition to the metals M7, M8 and M9.

In the abrasion-resistant layer, the content of carbon, nitrogen or a mixed element thereof is preferably from 5 to 70 atm %.

The thickness of the abrasion-resistant layer is preferably from 0.3 to 4 μm, and the film hardness is preferably HV 2000 or more. The scratch resistance is substantially dependent on the film thickness and film hardness of the abrasion-resistant layer and therefore, the film thickness and film hardness are preferably as high as possible.

(Color-Up Gradient Layer)

The color-up gradient layer 15 is formed by gradually decreasing the non-metal element content in a reaction compound between an alloy combining a metal M10 selected from one or two of Mo and W and a metal M11 selected from one or two of Nb and Ta or further adding a metal M12 selected from one member or two or more members of Cr, Ti, Hf and Zr, and a non-metal element selected from one member or two or more members of carbon, nitrogen and oxygen. For example, the layer is composed of a carbide film, a nitride film, a carbonitride film, an oxynitride film, an oxycarbide film, or an oxynitride-carbide film. Determination of what a material should be selected is dependent on the compatibility with the abrasion-resistant layer 14, the required external color and the usage environment of the coat. Also, the alloy may contain a metal such as V, B, Al, Si, Mn, Co, La, Ce, Y and Sc in a total ratio of 5 wt % or less based on the alloy, in addition to the metals M10, M11 and M12.

The color-up gradient layer is a gradient film in which the content of the non-metal element, preferably carbon, nitrogen or a mixed element thereof, is gradually decreased in the range of 50 to 0 atm % based on the alloying metal element.

The thickness of the color-up gradient layer is preferably from 0.05 to 0.3 μm. If the thickness of the color-up gradient layer is 0.05 μm or less, the color of the abrasion-resistant layer cannot be sufficiently raised. If the thickness is 0.3 μm or more, although the color of the abrasion-resistant layer can be sufficiently raised, the scratch resistance is reduced due to increase in the thickness of the color-up gradient layer of which hardness is low.

(Production Method)

Each stacked layer constituting the hard decorative member can be formed by a sputtering method, a CVD method, an ion plating method or the like but is preferably formed by a reactive sputtering method.

The white hard decorative member 10 of the embodiment is manufactured by a reactive sputtering method. The sputtering method is a method where while introducing an inert gas (mainly an Ar gas) into a chamber evacuated to a vacuum, a DC or AC high voltage is applied between a base material and a target composed of constituent atoms of the coat so as to cause the ionized Ar to collide with the target and the target substance flicked out is formed on the base material. By introducing a slight amount of a reactive gas together with the inert gas, a coat of a compound between the target constituent atom and the reactive gas can be formed on the base material. The decorative member 10 of the embodiment is manufactured by selecting the target constituent atom and the reactive gas and adjusting their amounts, thereby controlling the adherence, film hardness and color tone.

The reactive sputtering method has high capability of controlling the film quality or film thickness and is easy to automatize. Also, the energy of the atom sputtered is high and therefore, the base material need not be heated for enhancing the adherence, so that a coat can be formed even on a base material having a low melting point, such as plastic. Furthermore, this is a method where a target substance flicked out is formed on a base material, so that even a high-melting-point material can be deposited and the material can be freely selected. In addition, formation of, for example, a carbide film, a nitride film, a carbonitride film, an oxynitride film, an oxycarbide film or an oxynitride-carbide film is facilitated by selecting or mixing the reactive gas. Moreover, formation of an alloy coat, for example, an alloy carbide, nitride, carbonitride, oxynitride, oxycarbide or oxynitride-carbide film, is possible by alloying the target constituent atoms.

The gradient adherence layer 13 and the color-up gradient layer 15 of the white hard decorative member 10 of the embodiment are formed by increasing or decreasing in a time-series matter the amount of the reactive gas selected. The amount of the reactive gas is adjusted by the control of a mass flow controller that is automatically controlled, and the color tone and hardness of the layer can be controlled by the amount of the reactive gas.

According to this manufacturing method, a white hard decorative member having characteristics described above can be obtained.

<Watch>

The watch has the above-described white hard decorative member in a part of its constituent components, for example, in an exterior component. The watch may be any of a photoelectric driven watch, a thermoelectric driven watch, a standard time electric wave-receiving type self-correcting watch, a mechanical watch and a general electronic watch. Such a watch is manufactured using the above-described white hard decorative member by a known method. The watch is one example of the decorative member susceptible to scratching due to rubbing against a shirt or collision with a desk, a wall or the like. By forming the white hard decorative member in a watch, the watch is less likely to be scratched over a long period of time and can maintain the exterior appearance in a very beautiful state.

<Scratch Resistance Test Method>

In the scratch resistance test, a decorative film was applied to an SUS316L base material specified in JIS, and the test sample was put into contact with an abrasion paper having uniformly dispersed therein alumina particles under a constant load and rubbed by the paper a given number of times to cause scratches. The test sample surface with scratches was scanned in the direction perpendicular to the scratch direction to measure the surface roughness, and the scratch resistance was evaluated as the root-mean-square roughness. The scratch resistance can be numerically evaluated, because as the amount of scratches manufactured is larger and as the depth of the scratch is deeper, the numerical value of the root-mean-square roughness becomes larger and on the contrary, as the amount of scratches manufactured is smaller and as the depth of the scratch is shallower, the numerical value of the root-mean-square roughness becomes smaller.

<Film Hardness Measurement Method>

The measurement of the film hardness was performed using a micro-indentation hardness tester (H100, manufactured by FISCHER). A Vickers indenter was used for the gauge head and held under a load of 5 mN for 10 seconds and after deloading, the film hardness was calculated from the depth to which the Vickers indenter was inserted.

<Corrosion Resistance Test Method>

In a CASS test according to JIS-H 8502, the sample was placed for 48 hours in an atmosphere where a solution obtained by adding cupric chloride to a sodium chloride solution made acidic with acetic acid was sprayed, and separation and discoloration of the decorative film were observed to evaluate the corrosion resistance.

In an artificial sweat test according to ISO12870, the sample was placed in an atmosphere exposed to a solution (artificial sweat) obtained by mixing sodium chloride and lactic acid, at 55° C. for 48 hours, and the degree of discoloration of the decorative film was observed to evaluate the corrosion resistance.

As for the resistance to alkali, after dipping in an aqueous 5% sodium hydroxide solution under the conditions of 24 hours and 30° C., separation and discoloration of the decorative film were observed to evaluate the corrosion resistance.

As for the resistance to hypochlorous acid, after dipping in an aqueous 1%, 3% or 6% sodium hypochlorite solution under the conditions of 3 hours and 30° C., separation and discoloration of the decorative film were observed to evaluate the corrosion resistance.

<Etching Test Method>

The sample was dipped in a solution of 60% heated nitric acid at 80° C. or a solution of 40% nitric acid, 25% sulfuric acid and 4% hydrofluoric acid, and the time at which the decorative film was completely separated from the base material was measured to evaluate the etching property.

EXAMPLE 1

Figure 2:
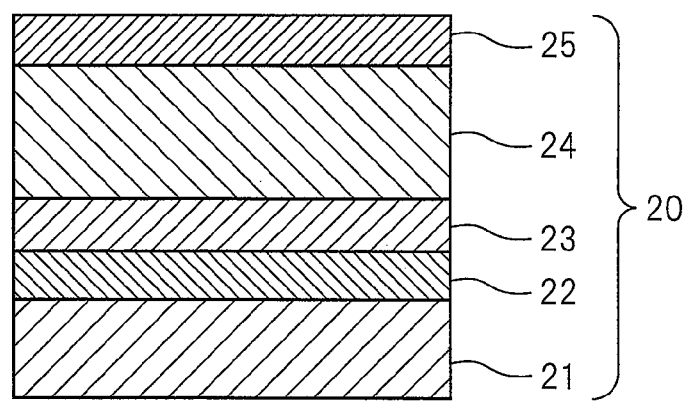
Figure 3:
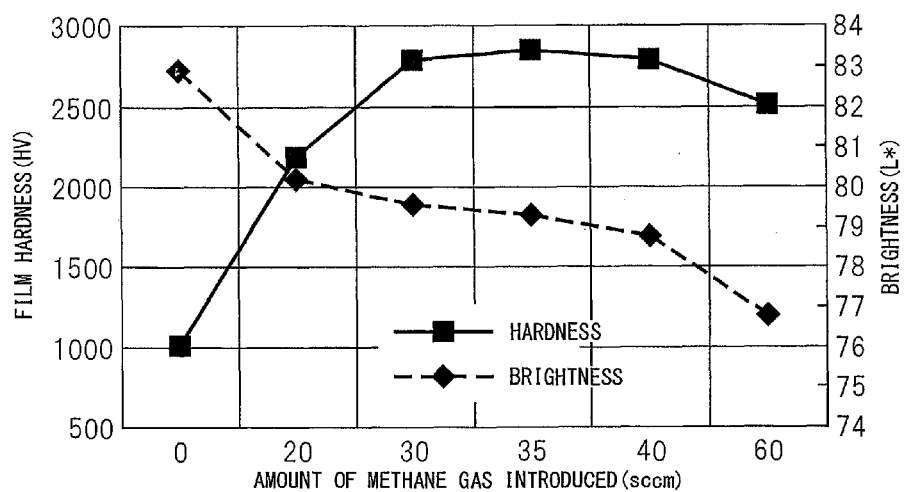
Figure 4:
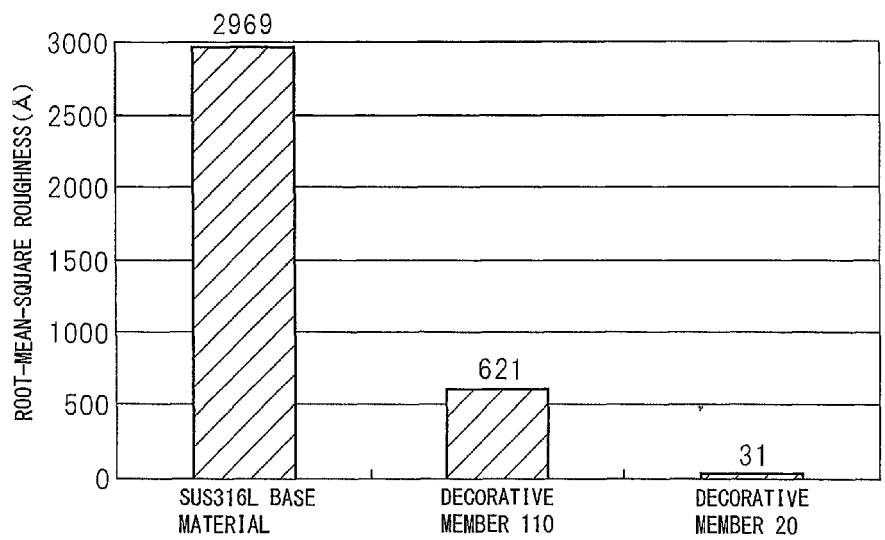

The first Example of the white hard decorative member is described by using FIGS. 2, 3 and 4. FIG. 2 is a cross-sectional schematic view of the white hard decorative member 20 of Example 1; FIG. 3 is a graph illustrating the changes in hardness and brightness with respect to the amount of methane gas introduced; and FIG. 4 is a scratch resistance measurement graph of the white hard decorative member 20.

As for the composition of the sputtering target of Example 1, a sintered body composed of 45 wt % of Mo and 55 wt % of Nb was used. An SUS316L material specified in JIS was used as the base material 21, and an adherence layer 22 composed of a lower oxide of an MoNb alloy was formed at a thickness of 0.1 μm on the base material 21 by the sputtering method. Thereafter, while introducing a slight amount of oxygen gas, a gradient adherence layer 23 of an MoNb alloy oxycarbide film in which the amount of methane gas was gradually increased was formed at a thickness of 0.2 μm. Furthermore, a thin-film abrasion-resistant layer 24 composed of an MoNb alloy carbide film was formed at a thickness of 2.2 μm, and a color-up gradient layer 25 of an MoNb alloy carbide film in which the amount of methane gas was gradually decreased was then formed at a thickness of 0.1 μm, whereby a white hard decorative member 20 was manufactured. The exterior color of the white hard decorative member 20 obtained in Example 1 was, in the Lab color space expression, L*: 82.1, a*: 0.61, and b*: 3.31 and was almost the same color as the exterior color of the SUS316L base material 21, which is L*: 85.1, a*: 0.38 and b*: 2.34.

FIG. 3 is a graph illustrating the changes in hardness and brightness of the white hard decorative member 20 of Example 1 when the amount of methane gas introduced was changed while keeping a constant Ar gas amount of 105 sccm. The film hardness had a certain peak according to the amount of methane gas introduced, and the brightness was slowly decreased in accordance with the amount of methane gas introduced. As the adherence layer 22 of the white hard decorative member 20, an MoNb lower oxide film was formed at a thickness of 0.1 μm while introducing 5 sccm of oxygen gas under the condition that the amount of methane gas introduced in FIG. 3 was 0 sccm. By virtue of employing an MoNb lower oxide, the adherence to the base material can be increased as compared with that of an MoNb alloy film and the scratch resistance can be enhanced. As the gradient adherence layer 23, while introducing 3 sccm of oxygen gas, an MoNb alloy carbide film was formed at a thickness of 0.2 μm by gradually increasing the amount of methane gas introduced in FIG. 3 from 0 sccm to 35 sccm showing the maximum hardness. As the abrasion-resistant layer 24, an MoNb alloy carbide film was formed at a thickness of 2.2 μm under the condition that the amount of methane gas introduced was 35 sccm showing the maximum hardness. As the color-up gradient layer 25, an MoNb alloy carbide film was formed at a thickness of 0.2 μm by gradually decreasing the amount of methane gas introduced in FIG. 3 from 35 sccm showing the maximum hardness to 0 sccm.

The gradient adherence layer 23 in the white hard decorative member 20 of Example 1 eliminates a distinct interface between the adherence layer and the abrasion-resistant layer, so that integration of the base material with the adherence layer can be achieved. The presence of the gradient adherence layer makes it possible to sufficiently secure the adherence between the adherence layer and the abrasion-resistant layer and also, due to a structure where the film stress gradually increases, an effect of suppressing generation of a crack and separation due to a stress strain is obtained, as a result, the scratch resistance and abrasion resistance are enhanced and at the same time, the abrasion-resistant layer having high film hardness can be formed at a large thickness. The scratch resistance is substantially determined by the product of the hardness of the abrasion-resistant layer, the film thickness of the abrasion-resistant layer and the degree of adhesion to the base material and therefore, the increase in adherence to the base material can lead to enhancement of the scratch resistance.

In the color-up gradient layer 25 of the white hard decorative member 20 of Example 1, the carbon content is gradually decreased to allow for gradient rise of L* in the Lab color space expression and thereby make the exterior color close to the color of SUS316L material as the base material and at the same time, high adherence to the abrasion-resistant layer 24 contributes to an effect that even when scratched, separation hardly occurs and the scratch is less recognizable.

FIG. 4 is a graph when the scratch resistance performance of the white hard decorative member 20 of Example 1 was measured. The graph shows the results when a decorative member 110 for comparison manufactured based on Patent Document 1, the white hard decorative member 20 of Example 1, and an SUS316L base material on which a hard film is not formed were measured for the scratch resistance (root-mean-square roughness). It is confirmed from FIG. 4 that the white hard decorative member 20 of Example 1 is far improved in the scratch resistance performance as compared with the decorative member 110 manufactured based on Patent Document 1 and of course with the SUS316L base material having not formed thereon a hard film.

The X-ray diffraction measurement results of MoNb alloy carbide films produced by changing the MoNb alloying ratio are shown in Table 1. The diffraction peak is confirmed to be shifted in response to the ratio between Mo and Nb forming a complete solid solution, and this implies that the MoNb alloy carbide film formed is an alloy according to the ratio of respective components.

TABLE 1

| of Mo | Proportion of Nb | Diffraction Peak of Carbide (hkl) | | | | |
|---|---|---|---|---|---|---|
| (wt %) | (wt %) | (111) | (200) | (220) | (311) | (222) |
| 100 | 0 | 36.50 | 41.96 | 61.08 | 73.10 | 76.88 |
| 70 | 30 | 35.60 | 41.15 | 59.79 | 71.63 | 75.17 |
| 30 | 70 | 34.70 | 40.44 | 58.43 | 69.98 | 73.31 |
| 0 | 100 | 34.38 | 40.08 | 57.84 | 69.22 | 73.02 |

The hardness, corrosion resistance, etching property and overall evaluation of each of the carbide film, the nitride film and the carbonitride film with respect to the MoNb alloying ratio are shown in Table 2. As seen in Table 2, the maximum hardness, corrosion resistance and etching property are changed according to the alloying ratio, and these properties can be freely adjusted by the alloying ratio. When the proportion of Mo is increased, the brightness increases, and the adherence to the base material is also enhanced to allow for formation as a thick film, which is advantageous in view of scratch resistance, but when Mo is used alone or the proportion of Mo is high, the corrosion resistance in a CASS test is bad and the film cannot be applied as a decorative member. Also, when the proportion of Nb is high, the film hardness is increased and this is advantageous in view of scratch resistance, but the brightness is reduced and in the case of using Nb alone, the film has a problem in the alkali resistance and cannot be applied as a decorative member. Furthermore, in the case of using Nb alone, the adherence to the base material is bad, and a thick film cannot be formed. By alloying Mo and Nb, weak points of respective components, such as brightness, corrosion resistance and adherence, can be compensated. In order to obtain a white hard decorative member excellent in the balance among color impression, scratch resistance and corrosion resistance, the proportion of Mo is preferably from 20 to 80 wt %, more preferably from 30 to 70 wt %.

TABLE 2

| Proportion of Mo (wt %) | Proportion of Nb (wt %) | Carbide Film Maximum Hardness | Nitride Film Maximum Hardness | Carbonitride Film (50:50) Maximum Hardness | Corrosion Resistance | | | Etching Property (1 µm) | | Overall Evaluation |
|---|---|---|---|---|---|---|---|---|---|---|
| | | | | | CASS, 48 h | Artificial Sweat, 48 h | Alkali | Heated Nitric Acid | Heated Nitric Acid + Hydrofluoric Acid | |
| 0 | 100 | 3151 | 2665 | | A | A | B | C | 430 sec | B |
| 30 | 70 | 2942 | 2670 | | A | A | A | C | 260 sec | A |
| 45 | 55 | 2845 | 2760 | 2810 | A | A | A | C | 130 sec | A |
| 70 | 30 | 2643 | 2710 | | A | A | A | C | 80 sec | A |
| 80 | 20 | 2617 | 2801 | 2710 | B | A | A | 600 sec | 50 sec | B |
| 100 | 0 | 2535 | 2325 | 2434 | C | A | A | 300 sec | 35 sec | C |

Mo and Nb constituting the white hard decorative member 20 are a material provoking absolutely no allergic response in the human body and therefore, a metal allergy as seen in the conventionally used Pt-based coat or the like does not occur.

EXAMPLE 2

Figure 5:
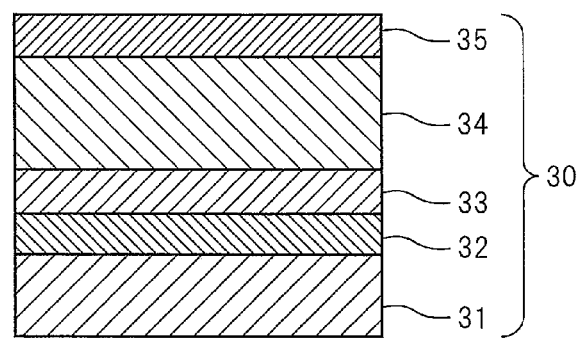
Figure 6:
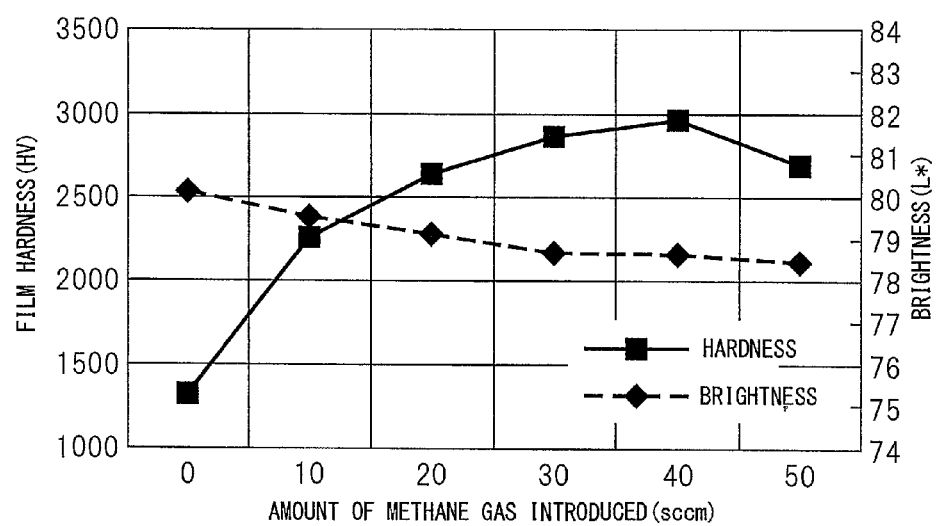
Figure 7:
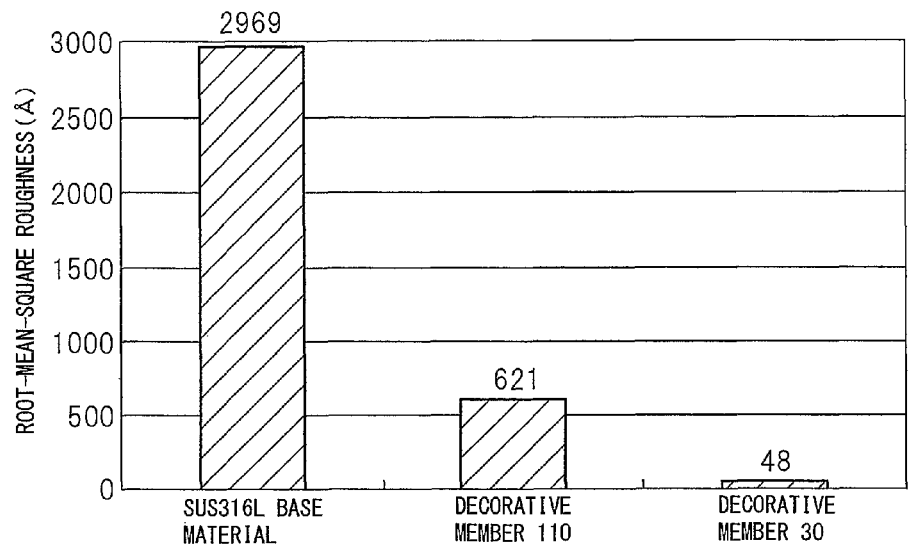

The second Example of the white hard decorative member is described by using FIGS. 5, 6 and 7. FIG. 5 is a cross-sectional schematic view of the white hard decorative member 30; FIG. 6 is a graph illustrating the changes in hardness and brightness with respect to the amount of methane gas introduced; and FIG. 7 is a scratch resistance measurement graph of the white hard decorative member 30.

As for the composition of the sputtering target of Example 2, a sintered body composed of 30 wt % of Mo and 70 wt % of Ta was used. An SUS316L material specified in JIS was used as the base material 31, and an adherence layer 32 composed of a lower oxide of an MoTa alloy was formed at a thickness of 0.1 µm on the base material 31 by the sputtering method. Thereafter, a gradient adherence layer 33 of an MoTa alloy carbide film in which the amount of methane gas was gradually increased was formed at a thickness of 0.2 µm. Furthermore, a thin-film abrasion-resistant layer 34 composed of an MoTa alloy carbide film was formed at a thickness of 2.0 µm, and a color-up gradient layer 35 of an MoTa alloy carbide film in which the amount of methane gas was gradually decreased was then formed at a thickness of 0.2 µm, whereby a white hard decorative member 30 was manufactured. The exterior color of the hard decorative member 30 obtained in Example 2 was, in the Lab color space expression, L*: 80.1, a*: 0.90, and b*: 3.35 and was almost the same color as the exterior color of the SUS316L base material 31, which is L*: 85.1, a*: 0.38 and b*: 2.34.

FIG. 6 is a graph illustrating the changes in hardness and brightness of the white hard decorative member 30 of Example 2 when the amount of methane gas introduced was changed while keeping a constant Ar gas amount of 105 sccm.

The film hardness had a certain peak according to the amount of methane gas introduced, and the brightness was slowly decreased in concordance with the amount of methane gas introduced. As the adherence layer 32 of the white hard decorative member 30, an MoTa lower oxide film was formed at a thickness of 0.1 μm while introducing 5 sccm of oxygen gas under the condition that the amount of methane gas introduced in FIG. 6 was 0 sccm. By virtue of employing an MoTa lower oxide, the adherence to the base material can be increased as compared with that of an MoTa alloy film and the scratch resistance can be enhanced. As the gradient adherence layer 33, an MoTa alloy carbide film was formed at a thickness of 0.2 μm by gradually increasing the amount of methane gas introduced in FIG. 6 from 0 sccm to 40 sccm showing the maximum hardness. As the abrasion-resistant layer 34, an MoTa alloy carbide film was formed at a thickness of 2.0 μm under the condition that the amount of methane gas introduced was 40 sccm showing the maximum hardness. As the color-up gradient layer 35, an MoTa alloy carbide film was formed at a thickness of 0.2 μm by gradually decreasing the amount of methane gas introduced in FIG. 6 from 40 sccm showing the maximum hardness to 0 sccm.

The gradient adherence layer 33 in the white hard decorative member 30 of Example 2 eliminates a distinct interface between the adherence layer and the abrasion-resistant layer, so that integration of the base material with the adherence layer can be achieved. The presence of the gradient adherence layer makes it possible to sufficiently secure the adherence between the adherence layer and the abrasion-resistant layer and also, due to a structure where the film stress gradually increases, an effect of suppressing generation of a crack and separation due to a stress strain is obtained, as a result, the scratch resistance and abrasion resistance are enhanced and at the same time, the abrasion-resistant layer having high film hardness can be formed at a large thickness. The scratch resistance is substantially determined by the product of the hardness of the abrasion-resistant layer, the film thickness of the abrasion-resistant layer and the degree of adhesion to the base material and therefore, the increase in adherence to the base material can lead to enhancement of the scratch resistance.

In the color-up gradient layer 35 of the white hard decorative member 30 of Example 2, the carbon content is gradually decreased to allow for gradient rise of L* in the Lab color space expression and thereby make the exterior color close to the color of SUS316L material as the base material and at the same time, high adherence to the abrasion-resistant layer 34 contributes to an effect that even when scratched, separation does not easily occur and the scratch is less recognizable.

FIG. 7 is a graph when the scratch resistance performance of the white hard decorative member 30 of Example 2 was measured. The graph shows the results when a decorative member 110 for comparison manufactured based on Patent Document 1, the white hard decorative member 30 of Example 2, and an SUS316L base material on which a hard film is not formed were measured for the scratch resistance (root-mean-square roughness). It is confirmed from FIG. 7 that the white hard decorative member 30 of Example 2 is far improved in the scratch resistance performance as compared with the decorative member 110 manufactured based on Patent Document 1 and of course with the SUS316L base material having not formed thereon a hard film.

The X-ray diffraction measurement results of MoTa carbide films produced by changing the MoTa alloying ratio are shown in Table 3. The diffraction peak is confirmed to be shifted in response to the ratio between Mo and Ta forming a complete solid solution, and this implies that the MoTa film formed becomes an alloy according to the ratio of respective components.

TABLE 3

| Proportion of Mo (wt %) | Proportion of Ta (wt %) | Diffraction Peak of Carbide (hkl) | | | | |
|---|---|---|---|---|---|---|
| | | (111) | (200) | (220) | (311) | (222) |
| 100 | 0 | 36.50 | 41.96 | 61.08 | 73.10 | 76.88 |
| 70 | 30 | 35.81 | 41.37 | 60.01 | 72.08 | 75.77 |
| 30 | 70 | 34.95 | 40.759 | 58.876 | 70.648 | 73.931 |
| 0 | 100 | 34.44 | 40.16 | 58.18 | 69.82 | 73.12 |

The hardness, corrosion resistance, etching property and overall evaluation of each of the carbide film, the nitride film and the carbonitride film with respect to the MoTa alloying ratio are shown in Table 4. As seen in Table 4, the maximum hardness, corrosion resistance and etching property are changed according to the alloying ratio, and these properties can be freely adjusted by the alloying ratio. When the proportion of Mo is increased, the brightness increases, and the adherence to the base material is also enhanced to allow for formation as a thick film, which is advantageous in view of scratch resistance, but when Mo is used alone or the proportion of Mo is high, the corrosion resistance in a CASS test or the like is bad and the film cannot be applied as a decorative member. Also, when the proportion of Ta is high, the film hardness is increased and this is advantageous in view of scratch resistance, but the brightness is reduced and the film cannot be applied as a decorative member. Furthermore, in the case of using Ta alone, the adherence to the base material is bad, and a thick film cannot be formed. By alloying Mo and Ta, weak points of respective components, such as brightness, corrosion resistance and adherence, can be compensated. The etching time is long as compared with the MoNb alloy film of Example 1 and thus, the corrosion resistance is high.

TABLE 4

| Proportion of Mo (wt %) | Proportion of Ta (wt %) | Carbide Film Maximum Hardness | Nitride Film Maximum Hardness | Carbonitride Film (50:50) Maximum Hardness | Corrosion Resistance | | | Etching Property (1 μm) | | Overall Evaluation |
|---|---|---|---|---|---|---|---|---|---|---|
| | | | | | CASS, 48 h | Artificial Sweat, 48 h | Alkali | Heated Nitric Acid | Heated Nitric Acid + Hydrofluoric Acid | |
| 0 | 100 | 3101 | 2714 | | A | A | A | C | 710 sec | B |
| 30 | 70 | 2963 | 2757 | 2847 | A | A | A | C | 640 sec | A |
| 70 | 30 | 2777 | 2789 | 2800 | A | A | A | C | 160 sec | A |
| 100 | 0 | 2535 | 2325 | 2694 | C | A | A | 300 sec | 35 sec | C |

In the case of using the film as a hard decorative member having a high-quality color and being excellent in scratch resistance and corrosion resistance, the proportion of Mo is, in the experimental range, preferably from 20 to 80 wt %, more preferably from 30 to 70 wt %.

Mo and Ta constituting the white hard decorative member 30 are a material provoking absolutely no allergic response in the human body and therefore, a metal allergy as seen in the conventionally used Pt-based coat or the like does not occur.

EXAMPLE 3

Figure 8:
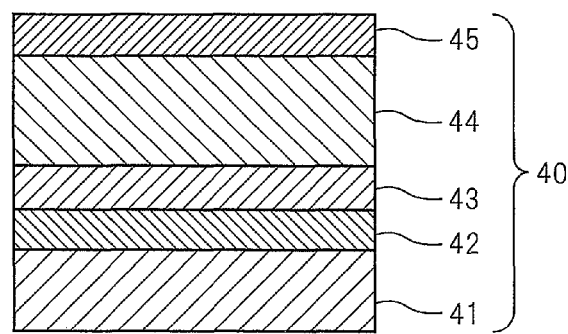
Figure 9:
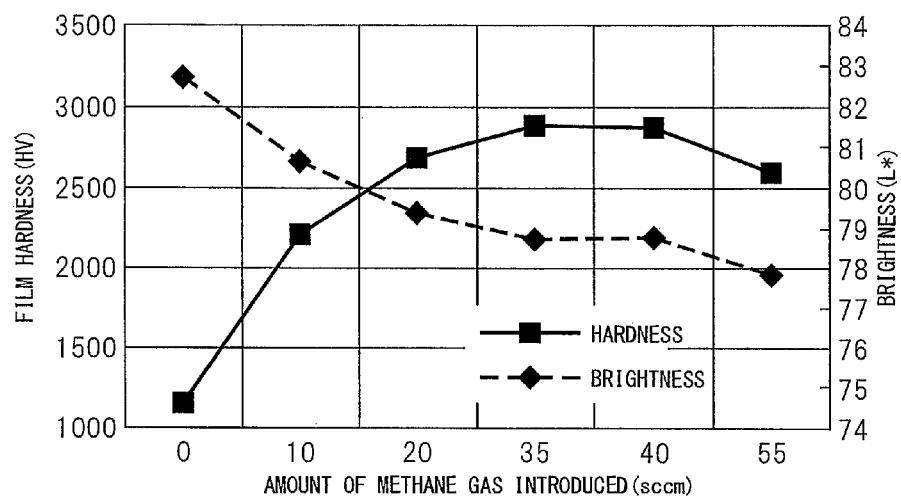
Figure 10:
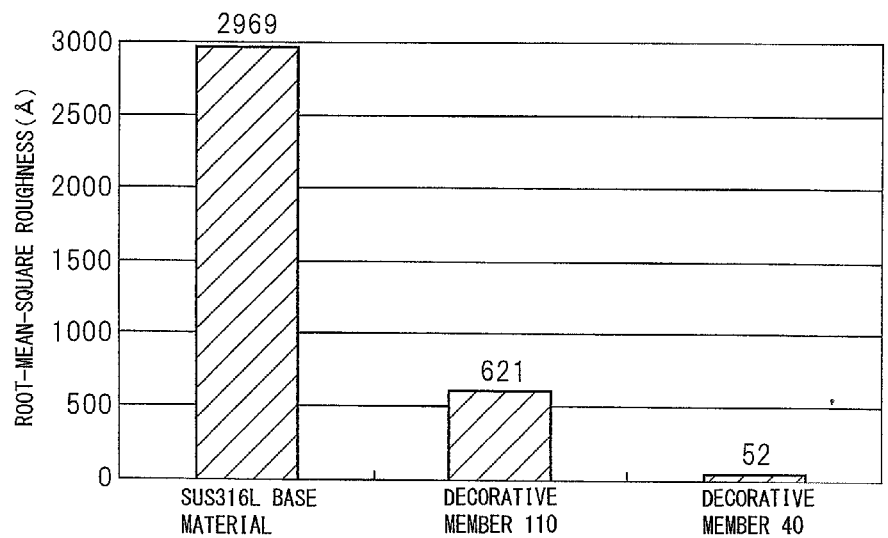

The third Example of the white hard decorative member is described by using FIGS. 8, 9 and 10. FIG. 8 is a cross-sectional schematic view of the white hard decorative member 40; FIG. 9 is a graph illustrating the changes in hardness and brightness with respect to the amount of methane gas introduced; and FIG. 10 is a scratch resistance measurement graph of the white hard decorative member 40.

As for the composition of the sputtering target of Example 3, a sintered body composed of 50 wt % of Mo, 25 wt % of Nb and 25 wt % of Ta was used. Mo, Nb and Ta can form a complete solid solution and therefore, can be adjusted to any ratio. An SUS316L material specified in JIS was used as the base material 41, and an adherence layer 42 composed of a lower oxide of an MoNbTa alloy was formed at a thickness of 0.1 μm on the base material 41 by the sputtering method. Thereafter, a gradient adherence layer 43 of an MoNbTa alloy oxycarbide film in which the amount of methane gas was gradually increased was formed at a thickness of 0.2 μm. Furthermore, a thin-film abrasion-resistant layer 44 composed of an MoNbTa alloy carbide film was formed at a thickness of 2.0 μm, and a color-up gradient layer 45 of an MoNbTa alloy carbide film in which the amount of methane gas was gradually decreased was then formed at a thickness of 0.2 μm, whereby a white hard decorative member 40 was manufactured. The exterior color of the white hard decorative member 40 obtained in Example 3 was, in the Lab color space expression, L*: 82.5, a*: 0.81, and b*: 3.08 and was almost the same color as the exterior color of the SUS316L base material 41, which is L*: 85.1, a*: 0.38 and b*: 2.34.

FIG. 9 is a graph illustrating the changes in hardness and brightness of the white hard decorative member 40 of Example 3 when the amount of methane gas introduced was changed while keeping a constant Ar gas amount of 105 sccm. The film hardness had a certain peak according to the amount of methane gas introduced, and the brightness was slowly decreased in concordance with the amount of methane gas introduced. As the adherence layer 42 of the white hard decorative member 40, an MoNbTa alloy lower oxide film was formed at a thickness of 0.1 μm while introducing 5 sccm of oxygen gas under the condition that the amount of methane gas introduced in FIG. 9 was 0 sccm. By virtue of employing an MoNbTa alloy lower oxide, the adherence to the base material can be increased as compared with that of an MoNbTa alloy film and the scratch resistance can be enhanced. As the gradient adherence layer 43, an MoNbTa alloy carbide film was formed at a thickness of 0.2 μm by gradually increasing the amount of methane gas introduced in FIG. 9 from 0 sccm to 35 sccm showing the maximum hardness. As the abrasion-resistant layer 44, an MoNbTa alloy carbide film was formed at a thickness of 2.0 μm under the condition that the amount of methane gas introduced was 35 sccm showing the maximum hardness. As the color-up gradient layer 45, an MoNbTa alloy carbide film was formed at a thickness of 0.2 μm by gradually decreasing the amount of methane gas introduced in FIG. 9 from 35 sccm showing the maximum hardness to 0 sccm.

The gradient adherence layer 43 in the white hard decorative member 40 of Example 3 eliminates a distinct interface between the adherence layer and the abrasion-resistant layer, so that integration of the base material with the adherence layer can be achieved. The presence of the gradient adherence layer makes it possible to sufficiently secure the adherence between the adherence layer and the abrasion-resistant layer and also, due to a structure where the film stress gradually increases, an effect of suppressing generation of a crack and separation due to a stress strain is obtained, as a result, the scratch resistance and abrasion resistance are enhanced and at the same time, the abrasion-resistant layer having high film hardness can be formed at a large thickness. The scratch resistance is substantially determined by the product of the hardness of the abrasion-resistant layer, the film thickness of the abrasion-resistant layer and the degree of adhesion to the base material and therefore, the increase in adherence to the base material can lead to enhancement of the scratch resistance.

In the color-up gradient layer 45 of the white hard decorative member 40 of Example 3, the carbon content is gradually decreased to allow for gradient rise of L* in the Lab color space expression and thereby make the exterior color close to the color of SUS316L material as the base material and at the same time, high adherence to the abrasion-resistant layer 44 contributes to an effect that even when scratched, separation does not readily occur and the scratch is less recognizable.

FIG. 10 is a graph when the scratch resistance performance of the white hard decorative member 40 of Example 3 was measured. The graph shows the results when a decorative member 110 for comparison manufactured based on Patent Document 1, the white hard decorative member 40 of Example 3, and an SUS316L base material on which a hard film is not formed were measured for the scratch resistance (root-mean-square roughness). It is confirmed from FIG. 14 that the white hard decorative member 40 of Example 2 is far improved in the scratch resistance performance as compared with the decorative member 110 manufactured based on Patent Document 1 and of course with the SUS316L base material having not formed thereon a hard film.

The hardness, brightness, corrosion resistance, etching property and overall evaluation with respect to the change in the alloying ratio of MoNbTa alloy are shown in Table 5. Mo, Nb and Ta can form a complete solid solution and therefore, can be freely changed to a ratio other than that of Example 3. When the proportion of Mo is increased, the brightness increases and the adherence to the base material is also enhanced to allow for formation as a thick film, which is advantageous in view of scratch resistance, but when Mo is used alone or the proportion of Mo is high, the corrosion resistance in a CASS test or the like is bad and the film cannot be applied as a decorative member. Also, when the proportion of Ta or Nb is high, the film hardness is increased and this is advantageous in view of scratch resistance, but the brightness is reduced and the film cannot be applied as a decorative member. Furthermore, in the case of using Ta or Nb alone, the adherence to the base material is bad, and a thick film cannot be formed. By alloying Mo, Ta and Nb, weak points of respective components, such as brightness, corrosion resistance and adherence, can be compensated.

TABLE 5

| Proportion of Mo (wt %) | Proportion of Nb (wt %) | Proportion of Ta (wt %) | Carbide Film Maximum Hardness | Nitride Film Maximum Hardness | Corrosion Resistance | | | Etching Property (1 μm) | | Overall Evaluation |
|---|---|---|---|---|---|---|---|---|---|---|
| | | | | | CASS, 48 h | Artificial Sweat, 48 h | Alkali | Heated Nitric Acid | Heated Nitric Acid + Hydrofluoric Acid | |
| 0 | 0 | 100 | 3101 | 2714 | A | A | A | C | 710 sec | B |
| 0 | 100 | 0 | 3151 | 2665 | A | A | B | C | 430 sec | B |
| 100 | 0 | 0 | 2535 | 2325 | C | A | A | 300 sec | 35 sec | C |
| 50 | 25 | 25 | 2897 | 2799 | A | A | A | C | 240 sec | A |

Mo, Nb and Ta constituting the white hard decorative member 40 are a material provoking absolutely no allergic response in the human body and therefore, a metal allergy by the conventionally used Pt-based coat or the like does not occur.

EXAMPLE 4

Figure 11:
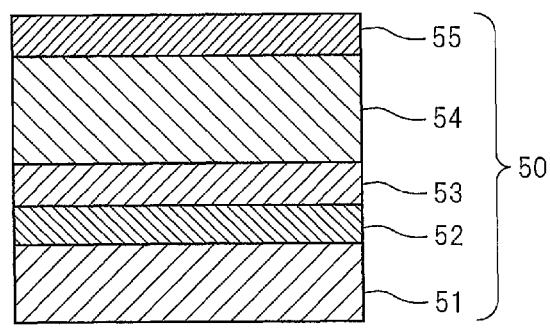
Figure 12:
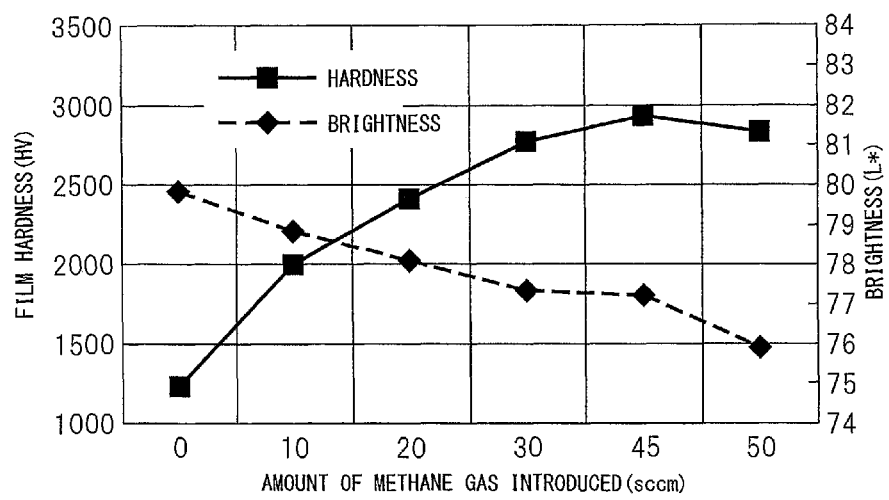
Figure 13:
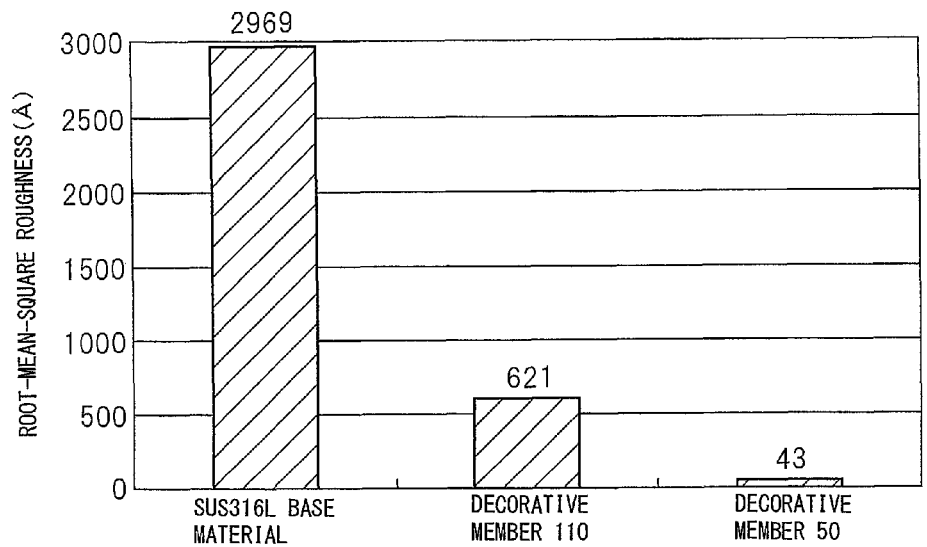

The fourth Example of the white hard decorative member is described by using FIGS. 11, 12 and 13. FIG. 11 is a cross-sectional schematic view of the white hard decorative member 50; FIG. 12 is a graph illustrating the changes in hardness and brightness with respect to the amount of methane gas introduced; and FIG. 13 is a scratch resistance measurement graph of the white hard decorative member 50.

As for the composition of the sputtering target of Example 4, a sintered body composed of 50 wt % of W and 50 wt % of Nb was used. W and Nb can form a complete solid solution and therefore, can be adjusted to any ratio. An SUS316L material specified in JIS was used as the base material 51, and an adherence layer 52 composed of a lower oxide of a WNb alloy was formed at a thickness of 0.1 μm on the base material 51 by the sputtering method. Thereafter, a gradient adherence layer 53 of a WNb alloy oxycarbide film in which the amount of methane gas was gradually increased was formed at a thickness of 0.2 μm. Furthermore, a thin-film abrasion-resistant layer 54 composed of a WNb alloy carbide film was formed at a thickness of 2.0 μm, and a color-up gradient layer 55 of a WNb alloy carbide film in which the amount of methane gas was gradually decreased was then formed at a thickness of 0.2 μm, whereby a white hard decorative member 50 was manufactured. The exterior color of the hard decorative member 50 obtained in Example 4 was, in the Lab color space expression, L*: 79.8, a*: 0.71, and b*: 3.37 and was almost the same color as the exterior color of the SUS316L base material 51, which is L*: 85.1, a*: 0.38 and b*: 2.34.

FIG. 12 is a graph illustrating the changes in hardness and brightness of the white hard decorative member 50 of Example 4 when the amount of methane gas introduced was changed while keeping a constant Ar gas amount of 105 sccm. The film hardness had a certain peak according to the amount of methane gas introduced, and the brightness was slowly decreased in concordance with the amount of methane gas introduced. As the adherence layer 52 of the white hard decorative member 50, a WNb lower oxide film was formed at a thickness of 0.1 μm while introducing 3 sccm of oxygen gas under the condition that the amount of methane gas introduced in FIG. 12 was 0 sccm. By virtue of employing a WNb lower oxide, the adherence to the base material can be increased as compared with that of a WNb alloy film and the scratch resistance can be enhanced. As the gradient adherence layer 53, a WNb alloy carbide film was formed at a thickness of 0.2 μm by gradually increasing the amount of methane gas introduced in FIG. 12 from 0 sccm to 45 sccm showing the maximum hardness. As the abrasion-resistant layer 54, a WNb alloy carbide film was formed at a thickness of 2.0 μm under the condition that the amount of methane gas introduced was 45 sccm showing the maximum hardness. As the color-up gradient layer 55, a WNb alloy carbide film was formed at a thickness of 0.2 μm by gradually decreasing the amount of methane gas introduced in FIG. 12 from 45 sccm showing the maximum hardness to 0 sccm.

The gradient adherence layer 53 in the white hard decorative member 50 of Example 4 eliminates a distinct interface between the adherence layer and the abrasion-resistant layer, so that integration of the base material with the adherence layer can be achieved. The presence of the gradient adherence layer makes it possible to sufficiently secure the adherence between the adherence layer and the abrasion-resistant layer and also, due to a structure where the film stress gradually increases, an effect of suppressing generation of a crack and separation due to a stress strain is obtained, as a result, the scratch resistance and abrasion resistance are enhanced and at the same time, the abrasion-resistant layer having high film hardness can be formed at a large thickness. The scratch resistance is substantially determined by the product of the hardness of the abrasion-resistant layer, the film thickness of the abrasion-resistant layer and the degree of adhesion to the base material and therefore, the increase in adherence to the base material can lead to enhancement of the scratch resistance.

In the color-up gradient layer 55 of the white hard decorative member 50 of Example 4, the carbon content is gradually decreased to allow for gradient rise of L* and thereby make the exterior color close to the color of SUS316L material as the base material and at the same time, high adherence to the abrasion-resistant layer 54 contributes to an effect that even when scratched, separation hardly occurs and the scratch is less recognizable.

FIG. 13 is a graph when the scratch resistance performance of the white hard decorative member 50 of Example 4 was measured. The graph shows the results when a decorative member 110 for comparison manufactured with reference to Patent Document 1, the white hard decorative member 40 of Example 4, and an SUS316L base material on which a hard film is not formed were measured for the scratch resistance (root-mean-square roughness). It is confirmed from FIG. 13 that the hard decorative member 50 of Example 4 is far improved in scratch resistance performance as compared to the decorative member 110 manufactured with reference to Patent Document 1 and of course with the SUS316L base material having not formed thereon a hard film.

The hardness, corrosion resistance, etching property and overall evaluation of WNb alloy are shown in Table 6. W and Nb can form a complete solid solution and therefore, can be freely changed to a ratio other than that of Example 4. W has higher film hardness than Mo and therefore, the scratch resistance is enhanced as compared with the Mo alloy film, but the corrosion resistance is poor similarly to the Mo alloy and therefore, the amount of a highly corrosion-resistant material such as Nb and Ta must be made large. By solid dissolution of Ta having higher corrosion resistance than Nb, the corrosion resistance can be enhanced. It is seen that the WNb alloy carbide film is comprehensively excellent in the corrosion resistance as compared to a carbide film of W or Nb alone.

TABLE 6

| Proportion of W (wt %) | Proportion of Nb (wt %) | Carbide Film Maximum Hardness | Corrosion Resistance | | | Etching Property (1 μm) | | Overall Evaluation |
|---|---|---|---|---|---|---|---|---|
| | | | CASS, 48 h | Artificial Sweat, 48 h | Alkali | Heated Nitric Acid | Heated Nitric Acid + Hydrofluoric Acid | |
| 100 | 0 | 2790 | C | A | A | 250 sec | 30 sec | C |
| 0 | 100 | 3151 | A | A | B | C | 430 sec | B |
| 50 | 50 | 2931 | A | A | A | C | 310 sec | A |

W and Nb constituting the hard decorative member 50 are a material provoking absolutely no allergic response in the human body and therefore, a metal allergy as seen in the conventionally used Pt-based coat or the like does not occur.

Mo and W are a material having high adherence to the base material and particularly, Mo has high brightness. However, Mo and W are poor in the corrosion resistance and cannot be used individually as a decorative member. Nb and Ta are a material having high film hardness and also having very high corrosion resistance, but because of a problem that the adherence to the base material is low to prohibit formation as a thick film and the brightness is also low, a high-grade quality as a decorative member cannot be obtained. An alloy is formed, whereby strong points and weak points of those metals can mutually complement each other and a hard decorative member giving a high-quality color impression and exhibiting excellent resistance particularly to scratch and corrosion over a long period of time can be provided. All of Mo, W, Nb and Ta are a material capable of forming a complete solid solution, and it is easy to alloy two or more thereof and form a film from the alloy, so that the film hardness, brightness, corrosion resistance, adherence and the like can be freely controlled and the scratch resistance can be drastically enhanced. In addition, a nitride, a carbide, an oxide, an oxynitride, an oxycarbide, a nitrocarbide or an oxynitride-carbide of such an alloy can be also easily formed by adjusting the reactive gas, and the composition can be varied according to the required characteristics.

EXAMPLE 5

Figure 14:
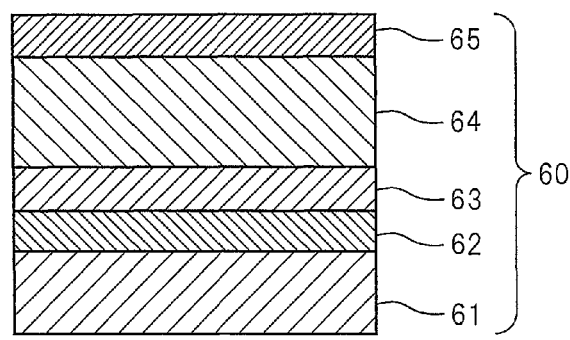
Figure 15:
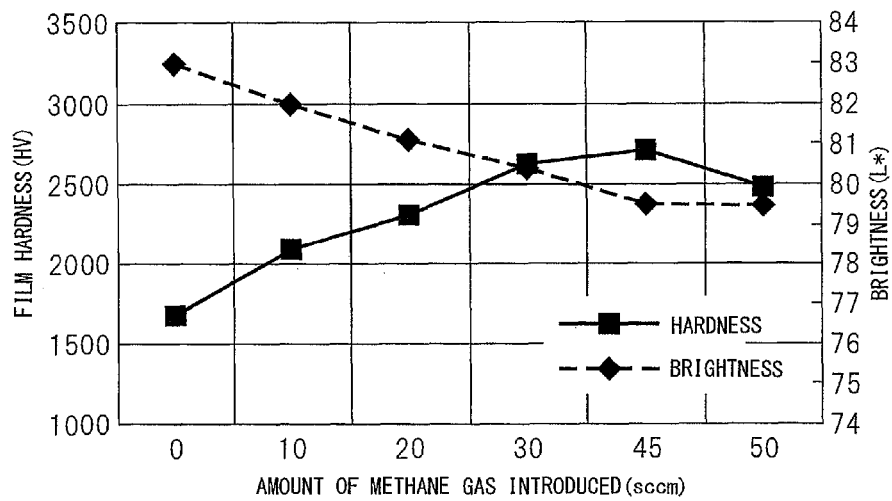
Figure 16:
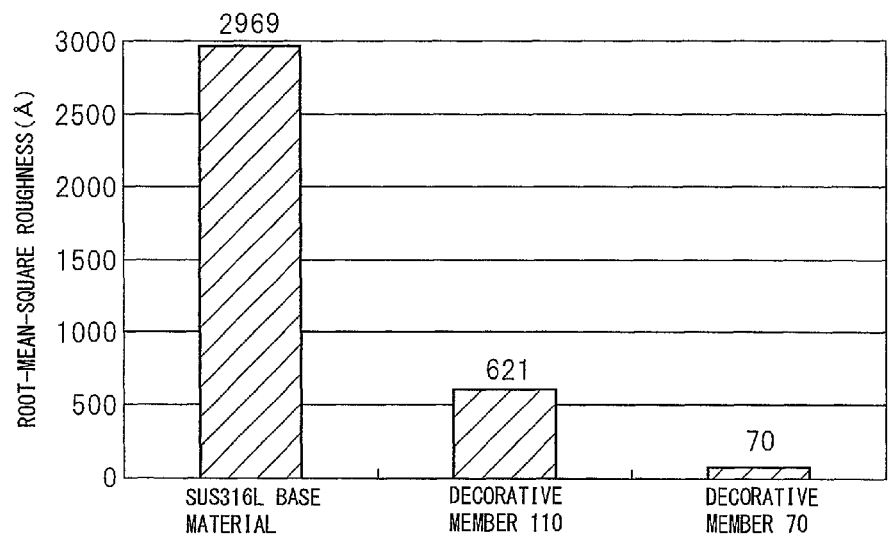

The fifth Example of the hard decorative member is described by using FIGS. 14, 15 and 16. FIG. 14 is a cross-sectional schematic view of the hard decorative member 60; FIG. 15 is a graph illustrating the changes in hardness and brightness with respect to the amount of methane gas introduced; and FIG. 16 is a scratch resistance measurement graph of the hard decorative member 60.

As for the composition of the sputtering target of Example 5, a sintered body composed of 60 wt % of Mo, 30 wt % of Nb and 10 wt % of Cr was used. An SUS316L material specified in JIS was used as the base material 61, and an adherence layer 62 composed of a lower oxide of an MoNbCr alloy was formed at a thickness of 0.1 μm on the base material 61 by the sputtering method. Thereafter, a gradient adherence layer 63 of an MoNbCr alloy oxycarbide film in which the amount of methane gas was gradually increased was formed at a thickness of 0.2 μm. Furthermore, a thin-film abrasion-resistant layer 64 composed of an MoNbCr alloy carbide film was formed at a thickness of 2.0 μm, and a color-up gradient layer 65 of an MoNbCr alloy carbide film in which the amount of methane gas was gradually decreased was then formed at a thickness of 0.2 μm, whereby a white hard decorative member 70 was manufactured. The exterior color of the white hard decorative member 70 obtained in Example 6 was, in the Lab color space expression, L*: 83.2, a*: 0.61, and b*: 2.78 and was almost the same color as the exterior color of the SUS316L base material 61, which is L*: 85.1, a*: 0.38 and b*: 2.34.

FIG. 15 is a graph illustrating the changes in hardness and brightness of the white hard decorative member 60 of Example 5 when the amount of methane gas introduced was changed while keeping a constant Ar gas amount of 105 sccm. The film hardness had a certain peak according to the amount of methane gas introduced, and the brightness was slowly decreased in concordance with the amount of methane gas introduced. As the adherence layer 62 of the white hard decorative member 60, an MoNbCr lower oxide film was formed at a thickness of 0.1 μm while introducing 3 sccm of oxygen gas under the condition that the amount of methane gas introduced in FIG. 15 was 0 sccm. By virtue of employing an MoNbCr lower oxide, the adherence to the base material can be increased as compared with that of an MoNbCr alloy film and the scratch resistance can be enhanced. As the gradient adherence layer 63, an MoNbCr alloy carbide film was formed at a thickness of 0.2 μm by gradually increasing the amount of methane gas introduced in FIG. 15 from 0 sccm to 40 sccm showing the maximum hardness. As the abrasion-resistant layer 64, an MoNbCr alloy carbide film was formed at a thickness of 2.0 μm under the condition that the amount of methane gas introduced was 40 sccm showing the maximum hardness. As the color-up gradient layer 65, an MoNbCr alloy carbide film was formed at a thickness of 0.2 μm by gradually decreasing the amount of methane gas introduced in FIG. 15 from 40 sccm showing the maximum hardness to 0 sccm.

The gradient adherence layer 63 in the white hard decorative member 60 of Example 5 eliminates a distinct interface between the adherence layer and the abrasion-resistant layer, so that integration of the base material with the adherence layer can be achieved. The presence of the gradient adherence layer makes it possible to sufficiently secure the adherence between the adherence layer and the abrasion-resistant layer and also, due to a structure where the film stress gradually increases, an effect of suppressing generation of a crack and separation due to a stress strain is obtained, as a result, the scratch resistance and abrasion resistance are enhanced and at the same time, the abrasion-resistant layer having high film hardness can be formed at a large thickness. The scratch resistance is substantially determined by the product of the hardness of the abrasion-resistant layer, the film thickness of the abrasion-resistant layer and the degree of adhesion to the base material and therefore, the increase in adherence to the base material can lead to enhancement of the scratch resistance.

In the color-up gradient layer 65 of the white hard decorative member 60 of Example 5, the carbon content is gradually decreased to allow for gradient rise of L* and thereby make the exterior color close to the color of SUS316L material as the base material and at the same time, high adherence to the abrasion-resistant layer 74 contributes to an effect that even when scratched, separation does not readily hardly occur and the scratch is less recognizable.

FIG. 16 is a graph when the scratch resistance performance of the white hard decorative member 60 of Example 5 was measured. The graph shows the results when a decorative member 110 for comparison manufactured with reference to Patent Document 1, the white hard decorative member 60 of Example 5, and an SUS316L base material on which a hard film is not formed were measured for the scratch resistance (root-mean-square roughness). It is confirmed from FIG. 16 that the white hard decorative member 60 of Example 5 is far improved in the scratch resistance performance as compared with the decorative member 110 manufactured with reference to Patent Document 1 and of course with the SUS316L base material having not formed thereon a hard film.

The hardness, corrosion resistance, etching property and overall evaluation of MoNbCr alloy are shown in Table 7. The MoNbCr alloy is reduced in the scratch resistance due to addition of Cr and resulting decrease in the film hardness as compared with the MoNb alloy, but the addition of Cr having high brightness makes it possible to obtain high brightness and color tone close to a stainless steel color. Also, Cr is a material having very excellent corrosion resistance and therefore, by incorporating Cr, the corrosion resistance performance, particularly the corrosion resistance performance for hypochlorite, can be greatly enhanced.

TABLE 7

| Proportion of Mo (wt %) | Proportion of Nb (wt %) | Proportion of Cr (wt %) | Carbide Film Maximum Hardness | Nitride Film Maximum Hardness | Corrosion Resistance | | | Resistance to Hypochlorite | | | Etching Property (1 μm) | | Overall Evaluation |
|---|---|---|---|---|---|---|---|---|---|---|---|---|---|
| | | | | | CASS, 48 h | Artificial Sweat, 48 h | Alkali | 1% | 3% | 6% | Heated Nitric Acid | Heated Nitric Acid + Hydrofluoric Acid | |
| 100 | 0 | 0 | 2535 | 2325 | C | A | A | C | C | C | 300 sec | 35 sec | C |
| 0 | 100 | 0 | 3151 | 2665 | A | A | B | A | B | C | C | 430 sec | B |
| 0 | 0 | 100 | 1659 | 2046 | A | A | A | A | A | A | C | C | C |
| 60 | 30 | 10 | 2714 | 2631 | A | A | A | A | A | A | C | 1200 sec | A |

In the case of using the film as a white hard decorative member giving a high-quality color impression and exhibiting an excellent corrosion resistance performance, a higher Cr proportion is effective, but an excessively high Cr proportion causes great reduction in the etching performance and also the excessively high proportion of Cr having low film hardness causes decrease in the scratch resistance performance. For this reason, the Cr proportion is, in the experimental range, preferably from 0.5 to 30 wt %, more preferably from 0.5 to 20 wt %.

Cr is a material provoking an allergic response in the human body and therefore, in the case of using it for a watch exterior component or a personal ornament such as eyeglasses and accessory, a metal allergy must be taken into consideration. Accordingly, in the applications requiring consideration of a metal allergy, it is preferred to use Ti, Hf or Zr except for Cr or use an alloy of (Mo, W) and (Nb, Ta) without using Cr, Ti, Hf and Zr.

The corrosion resistance, etching property and overall evaluation of MoNb alloy obtained by alloying 10 wt % of Ti, Hf or Zr in place of Cr of Example 5 are shown in Table 8. Similarly to Cr, by alloying a Group 4 metal such as Ti, Hf and Zr, the corrosion resistance, particularly the corrosion resistance to hypochlorite, is enhanced. However, Ti, Hf and Zr are a material having low brightness and if the content ratio thereof is increased, the brightness is extremely reduced, failing in having a high-grade quality. Also, in the case of forming a nitride film from an alloy in which the content ratio of Ti, Hf or Zr is increased, slight coloration appears and a high-quality white color cannot be obtained. For these reasons, the content ratio of Ti, Hf or Zr is, in the experimental range, preferably from 0.5 to 20 wt %, more preferably from 0.5 to 10 wt %.

TABLE 8

| Alloying Ratio | Corrosion Resistance | | | Resistance to | | | Heated | Etching Property (1 μm) | |
|---|---|---|---|---|---|---|---|---|---|
| (Mo 60 wt %, | CASS, | Artificial | | Hypochlorite | | | Nitric | Heated Nitric Acid + | Overall |
| Nb 30 wt %) | 48 h | Sweat, 48 h | Alkali | 1% | 3% | 6% | Acid | Hydrofluoric Acid | Evaluation |
| Cr 10 wt % | A | A | A | A | A | A | C | 1200 sec | A |
| Ti 10 wt % | A | A | A | A | A | B | C | 160 sec | A |
| Hf 10 wt % | A | A | A | A | A | B | C | 160 sec | A |
| Zr 10 wt % | A | A | A | A | B | C | C | 100 sec | A |

Mo, W and Cr are a material having high adherence to the base material and particularly, Mo and Cr have high brightness. However, Mo and Cr are a material not having high film hardness and a high scratch resistance performance cannot be obtained. Also, Mo and W are poor in the corrosion resistance. Nb and Ta are a material having high film hardness and high corrosion resistance, but because of low adherence to the base material and low brightness, a high-grade quality as a decorative member cannot be obtained. Among the materials, Cr is a material having highest corrosion resistance performance. An alloy is formed, whereby strong points and weak points of those metals can mutually complement each other and a hard decorative member giving a high-quality color impression and exhibiting excellent resistance particularly to scratch and corrosion over a long period of time can be provided. It is easy to alloy two or more of Mo, W, Nb, Ta, Cr (Ti, Hf, Zr) and form a film from the alloy, so that the film hardness, brightness, corrosion resistance, adherence and the like can be freely controlled and the scratch resistance can be drastically enhanced. In addition, a nitride, a carbide, an oxide, an oxynitride, an oxycarbide, a nitrocarbide or an oxynitride-carbide of such an alloy can be also easily formed by adjusting the reactive gas, and the composition can be varied according to the required characteristics.

As described in the forgoing pages, the white hard decorative member includes a base material having thereon an alloy adherence layer having a high adherence effect, an alloy gradient adherence layer where the reaction gas content is gradually increased, an abrasion-resistant layer having high hardness, and an alloy color-up gradient layer where the reaction gas content is gradually decreased, which are formed by using a film of an alloy combining a metal having a high adherence effect to a metal and high brightness, a metal having high film hardness and high corrosion resistance, and a metal for adjusting the allergic activity, so that not only the adherence between the base material and the film can be remarkably enhanced and the scratch resistance can be increased but also the abrasion-resistant layer having high film hardness can be formed at a large thickness and in turn, the scratch resistance can be further increased. In addition, the corrosion resistance, brightness and etching property, such as film hardness, brightness, corrosion resistance, adherence and separation, can be freely controlled by the alloying ratio and furthermore, the allergic activity can be also adjusted, so that a decorative member satisfying all of high scratch resistance performance, high-grade quality and high corrosion resistance, which are unobtainable by conventional techniques as a personal ornament or a decorative trim, can be obtained.

INDUSTRIAL APPLICABILITY

The present invention provides a white hard decorative member prevented from reduction in the exterior quality due to scratch or abrasion and having a high-quality color impression and furthermore, because of being able to freely control the color tone, corrosion resistance performance, etching performance and allergy activity, can be utilized as a decorative member for an exterior component of a watch, a personal ornament such as eyeglasses, decorative trim, a sporting good and the like.

DESCRIPTION OF REFERENCE NUMERALS

10 Decorative member
11 Base material
12 Adherence layer
13 Gradient adherence layer
14 Abrasion-resistant layer
15 Color-up gradient layer
110 Decorative member
111 Base material
112 Adherence layer
113 Abrasion-resistant layer
114 Decoration-forming layer
20 Decorative member
21 Base material
22 Adherence layer
23 Gradient adherence layer
24 Abrasion-resistant layer
25 Color-up gradient layer
30 Decorative member
31 Base material
32 Adherence layer
33 Gradient adherence layer
34 Abrasion-resistant layer
35 Color-up gradient layer
40 Decorative member
41 Base material
42 Adherence layer
43 Gradient adherence layer
44 Abrasion-resistant layer
45 Color-up gradient layer
50 Decorative member
51 Base material
52 Adherence layer
53 Gradient adherence layer
54 Abrasion-resistant layer
55 Color-up gradient layer
60 Decorative member
61 Base material
62 Adherence layer
63 Gradient adherence layer
64 Abrasion-resistant layer
65 Color-up gradient layer

The invention claimed is:

1. A white hard decorative member comprising:
   a base material;
   an adherence layer composed of a lower oxide layer of an alloy combining a metal M1, a metal M2 and selectively, a metal M3, which is stacked on said base material;
   a gradient adherence layer composed of a reaction compound between an alloy combining a metal M4, a metal M5 and selectively, a metal M6 and a non-metal element selected from one member or two or more members of nitrogen, carbon and oxygen, which is stacked on said adherence layer;
   an abrasion-resistant layer composed of a reaction compound between an alloy combining a metal M7, a metal M8 and selectively, a metal M9 and a non-metal element selected from one member or two or more members of nitrogen, carbon and oxygen, which is stacked on said gradient adherence layer; and
   a color-up gradient layer composed of a reaction compound between an alloy combining a metal M10, a metal M11 and selectively, a metal M12 and a non-metal element selected from one member or two or more members of nitrogen, carbon and oxygen, which is stacked on said abrasion-resistant layer,
   wherein each of said metals M1, M4, M7 and M10 is selected from one or two of Mo and W,
   each of said metals M2, M5, M8 and M11 is selected from one or two of Nb and Ta,
   each of said metals M3, M6, M9 and M12 is selected from one member or two or more members of Cr, Ti, Hf and Zr,
   the non-metal element content in the reaction compound constituting said gradient adherence layer is gradually increased in a thickness direction with distance from the base material, and
   the non-metal element content in the reaction compound constituting said color-up gradient layer is gradually decreased in a thickness direction with distance from the base material.

2. The white hard decorative member according to claim 1, wherein said metals M3, M6, M9 and M12 are Cr.

3. The white hard decorative member according to claim 1, wherein in each of said layers, the alloying compositional ratio of said metal M1, M4, M7 or M10 and said metal M2, M5, M8 or M11 is 70 wt % or more based on all alloys.

4. The white hard decorative member according to claim 1, wherein an exterior color of the decorative member is a white color or a stainless steel color.

5. The white hard decorative member according to claim 1, wherein the thickness of said abrasion-resistant layer is from 0.5 to 4 μm.

6. The white hard decorative member according to claim 1, wherein the adherence layer contains oxygen of 5 to 60 atm % based on metals in the adherence layer, and the gradient adherence layer contains oxygen gradually increased from 0 to 50 atm % based on alloying metal elements in the gradient adherence layer.

7. A watch having an exterior component that is partially or entirely constituted by the white hard decorative member according to claim 1.

8. A method for manufacturing a white hard decorative member, the method comprising the steps of;
   stacking, on a base material, an adherence layer composed of a lower oxide layer of an alloy combining a metal M1, a metal M2 and selectively, a metal M3;
   stacking, on said adherence layer, a gradient adherence layer composed of a reaction compound between an alloy combining a metal M4, a metal M5 and selectively, a metal M6 and a non-metal element selected from one member or two or more members of nitrogen, carbon and oxygen such that the non-metal element content in the reaction mixture constituting said gradient adherence layer is gradually increased in a thickness direction with distance from the base material;
   stacking, on said gradient adherence layer, an abrasion-resistant layer composed of a reaction compound between an alloy combining a metal M7, a metal M8 and selectively, a metal M9 and a non-metal element selected from one member or two or more members of nitrogen, carbon and oxygen; and
   stacking, on said abrasion-resistant layer, a color-up gradient layer composed of a reaction compound between an alloy combining a metal M10, a metal M11 and a metal M12 and a non-metal element selected from one member or two or more members of nitrogen, carbon and oxygen such that the non-metal element content in the reaction compound constituting said color-up gradient layer is gradually decreased in a thickness direction distance from the base material,
   wherein each of said metals M1, M4, M7 and M10 is selected from one or two of Mo and W,
   each of said metals M2, M5, M8 and M12 is selected from one or two of Nb and Ta, and
   each of said metals M3, M6, M9 and M12 is selected from one member or two or more members of Cr, Ti, Hf and Zr.

9. The method for manufacturing a white hard decorative member according to claim 8, wherein in each of said layers, the alloying compositional ratio of said metal M1, M4, M7 or M10 and said metal M2, M5, M8 or M11 is 70 wt % or more based on all alloys.

10. The method for manufacturing a white hard decorative member according to claim 8, wherein said abrasion-resistant layer is stacked at a thickness of 0.5 to 4 μm.

11. The method for manufacturing a white hard decorative member according to claim 8, wherein oxygen is incorporated into the adherence layer in amount of 5 to 60 atm % based on metals in the adherence layer, and oxygen incorporated into the gradient adherence layer is gradually increased in amount from 0 to 50 atm % based on alloying metal elements in the gradient adherence layer.

12. The method for manufacturing a white hard decorative member according to claim 8, wherein at least one of said adherence layer, said gradient adherence layer, said abrasion-resistance layer and said color-up gradient layer is stacked by a reactive sputtering method.

13. The method for manufacturing a white hard decorative member according to claim 12, wherein in the reactive sputtering method, each of said gradient adherence layer and said color-up gradient layer is stacked by increasing or decreasing the amount of a reaction gas containing said non-metal element.

* * * * *